United States Patent
Foster et al.

(10) Patent No.: US 6,603,072 B1
(45) Date of Patent: Aug. 5, 2003

(54) MAKING LEADFRAME SEMICONDUCTOR PACKAGES WITH STACKED DIES AND INTERCONNECTING INTERPOSER

(75) Inventors: Donald C. Foster, Mesa, AZ (US); David A. Zoba, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/828,046

(22) Filed: Apr. 6, 2001

(51) Int. Cl.[7] ............................. H05K 7/02; H01L 23/52
(52) U.S. Cl. ...................... 174/52.4; 361/729; 361/735; 257/686; 257/723; 257/777
(58) Field of Search ..................... 174/52.2, 52.3, 174/52.4; 361/729, 735, 742, 767, 770; 257/686, 723, 777, 782, 783

(56) References Cited

U.S. PATENT DOCUMENTS

| | | | |
|---|---|---|---|
| 5,012,323 A | 4/1991 | Farnworth | 357/75 |
| 5,070,390 A | 12/1991 | Shimizu | 357/70 |
| 5,291,061 A | 3/1994 | Ball | 257/686 |
| 5,332,864 A | 7/1994 | Liang et al. | 174/52.4 |
| 5,347,429 A | 9/1994 | Kohno et al. | 361/813 |
| 5,406,699 A | 4/1995 | Oyama | 29/827 |
| 5,455,387 A | 10/1995 | Hoffman et al. | 174/52.4 |
| 5,462,624 A | 10/1995 | Kwon | 156/257 |
| 5,471,369 A * | 11/1995 | Honda et al. | 361/813 |
| 5,615,475 A * | 4/1997 | Burns | 29/827 |
| 5,689,135 A | 11/1997 | Ball | 257/676 |
| 5,780,925 A | 7/1998 | Cipolla et al. | 257/676 |
| 5,780,926 A * | 7/1998 | Seo | 257/676 |
| 5,793,108 A | 8/1998 | Nakanishi et al. | 257/723 |
| 5,898,220 A | 4/1999 | Ball | 257/723 |
| RE36,613 E | 3/2000 | Ball | 257/777 |
| 6,104,084 A * | 8/2000 | Ishio et al. | 257/666 |

\* cited by examiner

*Primary Examiner*—Dean A. Reichard
*Assistant Examiner*—Carmelo Oliva
(74) *Attorney, Agent, or Firm*—Bever, Hoffman & Harms, LLP; James E. Parsons

(57) ABSTRACT

In a leadframe type of semiconductor package, the internal electrical interconnectability of and signal routing between multiple dies laminated in a stack with the die paddle of the leadframe is substantially enhanced by laminating an "interposer" in the stack. The interposer comprises a dielectric layer and a metallic layer patterned to include wire bonding pads arrayed around the periphery of a surface thereof, and circuit traces interconnecting selected ones of the wire bonding pads in a single plane across the horizontal span of the interposer. In packages having multiple dies and relatively few leads, the bonding pads and circuit traces can be flexibly arranged on the interposer by the package designer to substantially increase the number and routings of internal electrical interconnections otherwise possible between the dies and between the dies and the leads of the package.

33 Claims, 3 Drawing Sheets

MAKING LEADFRAME SEMICONDUCTOR PACKAGES WITH STACKED DIES AND INTERCONNECTING INTERPOSER

BACKGROUND

1. Technical Field

This invention generally pertains to semiconductor packaging, and more particularly, to using an interposer in leadframe semiconductor packages having multiple, stacked dies for enhanced electrical interconnections and signal routing between the dies and the leads of the package.

2. Related Art

A demand for electronic devices that are smaller and lighter, yet more functional, has resulted in a concomitant demand for semiconductor packages that have smaller outlines and mounting footprints, yet which are capable of increased component packaging densities. One approach to satisfying this demand has been the development of techniques for stacking the semiconductor dies, or "chips," contained in the package on top of one another. Examples of die-stacking techniques may be found, for example, in U.S. Pat. Nos. 5,323,060 and 5,721,452 to R. Fogel, et al.; U.S. Pat. No. 5,815,372 to W. N. Gallas; U.S. Pat. No. 5,898,220 and U.S. Pat. No. Re. 36,613 to M. B. Ball.

A common problem experienced with packages containing multiple dies, and particularly in leadframe types of packages, is the paucity of internal electrical interconnections and signal routings possible between the dies themselves, and between the dies and the input/output terminals of the package. In the case of leadframe packages, these terminals consist of the leads of the leadframe, which may be relatively few in comparison with the number of wire bonding pads on the dies. Thus, the packaging of multiple dies in a leadframe package format has typically been limited to a simple "fan-out" interconnection of the dies to the leads, with very limited die-to-die interconnection and signal routing capability. Multiple-die packages requiring a more complex die-to-die interconnection and routing capabilities have typically been implemented in relatively more expensive, laminate-based packages, e.g., Ball Grid Array ("BGA") packages.

A need therefore exists for a simple, low-cost method of enhancing the number and efficiency of internal electrical interconnectability and signal routing between the dies, and between the dies and the leads, of a leadframe type of semiconductor package having multiple, stacked dies.

SUMMARY

This invention provides method for enhancing the internal electrical interconnectability and signal routing between the dies and leads of a leadframe type of semiconductor package having multiple, stacked dies. The novel package of the invention includes a conventional metallic leadframe having a plurality of leads arrayed along the sides of a die paddle. A plurality of semiconductor dies, each having wire bonding pads arrayed around a periphery of the active surface thereof, are laminated in a stack with the die paddle of the leadframe, and optionally, with a spacer for spacing the dies apart in the stack.

Advantageously, an "interposer" is also laminated in the stack along with the dies and the die paddle. The interposer comprises at least one dielectric layer and at least one metallic layer that has been patterned to include a plurality of wire bonding pads arrayed around a periphery of a surface thereof, and a plurality of circuit traces interconnecting selected ones of the wire bonding pads across the span of the interposer.

A plurality of conventional wire bonds are made between selected ones of the die bonding pads, the interposer bonding pads, and the leads of the leadframe to electrically interconnect the package internally. The bonding pads and circuit traces, all of which lie in a single plane, can be simply and flexibly prearranged on the interposer to increase the number of internal electrical interconnections and signal routings otherwise possible between the dies and the leads of the package, which necessarily reside in multiple and different planes, and on different sides of the package.

A better understanding of the above and many other features and advantages of the present invention may be obtained from a consideration of the detailed description below of certain exemplary embodiments thereof, particularly if such consideration is made in conjunction with the figures of the appended drawings.

DESCRIPTION OF THE DRAWING FIGURES

DETAILED DESCRIPTION

Figure 8:
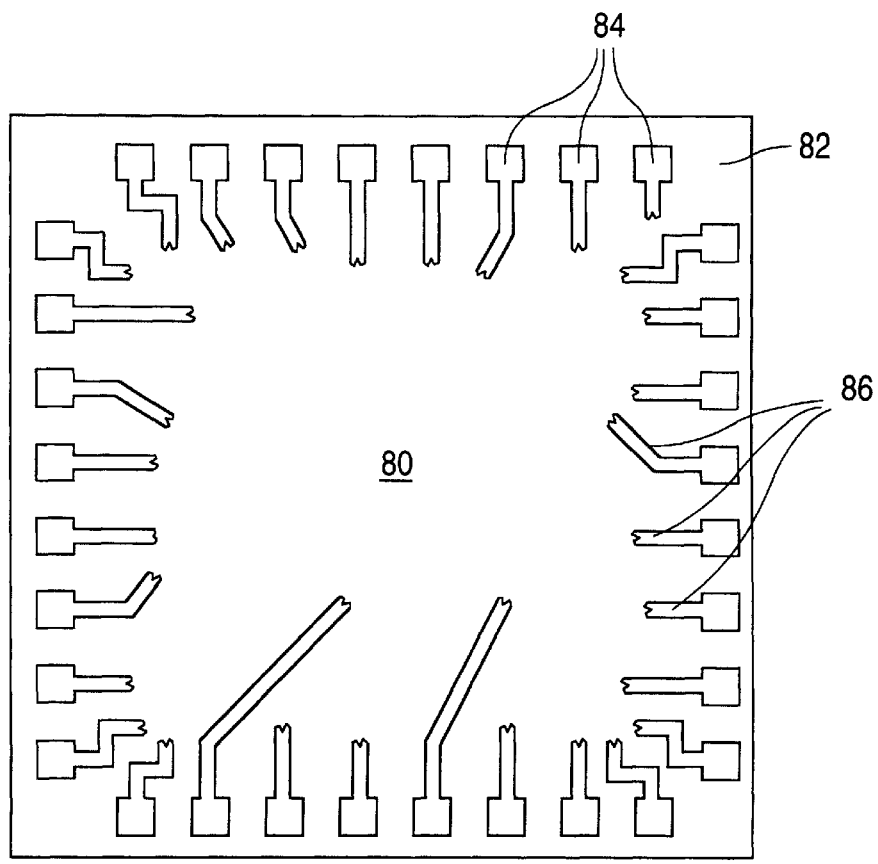

An exemplary embodiment of an interposer 80 of the type contemplated by the present invention is illustrated in the plan view of FIG. 8. The interposer 80 comprises a laminate of at least one layer of a dielectric material 82, and at least one layer of a metal that has been patterned to form a plurality of wire bonding pads 84 arrayed around the periphery of one surface of the interposer. A plurality of circuit traces 86 interconnect selected ones of the wire bonding pads 84 across the planar span of the interposer 80.

The interposer 80 may comprise a laminate of multiple dielectric and patterned metallic layers in which the metallic layers are interconnected through the thickness of the interposer by, e.g., plated-through holes, or "vias" (not illustrated). The interposer 80 can be fabricated of a variety of conventional Printed Circuit Board ("PCB") materials, e.g., copper on a polyimide resin film or a fiberglass-epoxy resin composite, or co-fired tungsten "ink" on a ceramic tape, or the like, and can be fabricated using a wide variety of well-known PCB fabrication techniques, e.g., photolithography techniques. Thus, the interposer 80 can be fabricated very inexpensively, using known PCB materials and manufacturing techniques, to provide a very flexible, enhanced signal routing and electrical interconnection capability across its entire span between selected ones of the bonding pads 84 at its periphery, and one that resides in a single plane.

Figure 1:
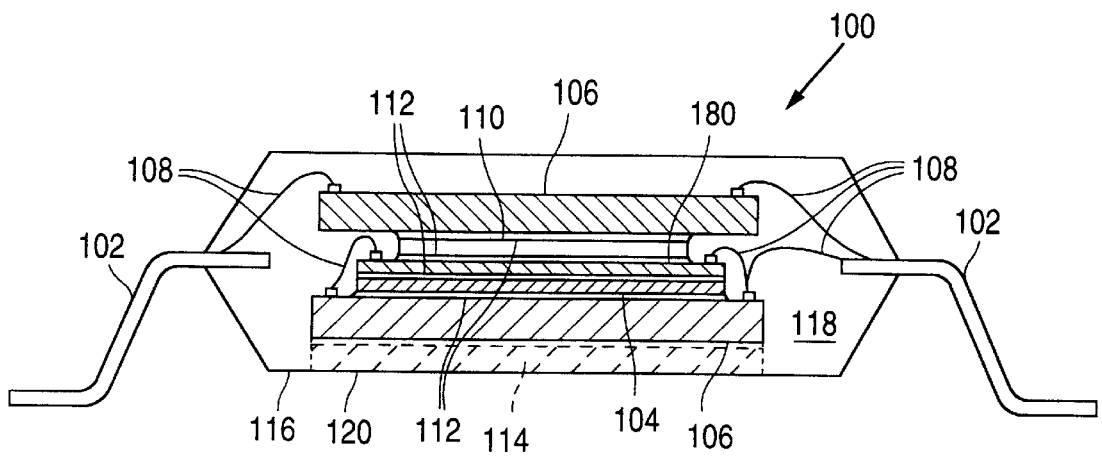
FIG. 1 is a cross-sectional, side elevation view of a first exemplary embodiment of a semiconductor package in accordance with the present invention.

A first exemplary embodiment of a leadframe semiconductor package 100 incorporating an interposer 180 in accordance with the present invention is illustrated in the cross-sectional side elevation view of FIG. 1. The novel package 100 comprises a conventional metallic leadframe having a plurality of leads 102 arrayed along the sides of a die paddle 104. A plurality of semiconductor dies 106, each having wire bonding pads (not visible in the figure) arrayed around a periphery of an active surface thereof, are laminated in a stack with the die paddle 104, and are electrically interconnected by a plurality of wire bonds 108 interconnecting selected ones of the die bonding pads and the leads 102 of the leadframe, in a known fashion.

In the first embodiment of the package 100 illustrated in FIG. 1, an interposer 180 is shown laminated in the stack of the die paddle 104 and dies 106 between an upper surface of the die paddle 104 and a lower surface of a spacer 110. The optional spacer 110 is laminated along with the other elements in the stack to space the upper die 106 in the stack sufficiently above the interposer 180 to permit the wire bonds 108 to be made to the wire bonding pads 84 (see FIG. 8) at the periphery of the upper surface thereof. For this purpose, the spacer 110, which may be a thick dielectric film or layer of adhesive, has an outer periphery that is smaller than an inner periphery of the wire bonding pads 84 on the interposer so that it does not obscure the pads for wire bonding.

As above, the wire bonding pads 84 and circuit traces 86 on the interposer 180 are prearranged thereon to increase the number and routing of internal electrical interconnections possible between the dies 106 themselves, and between the dies and the leads 102 of the package 100. By laminating the interposer 180 in the stack such that the peripheral wire bonding pads 84 thereon are positioned immediately adjacent to both the leads 102 of the lead frame and the wire bonding pads on the dies 106, the die-to-die and die-to-lead electrical interconnections and signal routings can be made across the horizontal span of the stack in a single plane, thereby minimizing the length of the wire bonds 108, and without the need for the wire bonds 108 to cross over the top or bottom surfaces of any of the elements of the stack.

In the first embodiment 100 of FIG. 1, the lower one of the two dies 106 in the stack is shown with its active, upper surface mounted in opposition to the lower surface of the die paddle 104. For this reason, the die paddle 104, like the spacer 110, is sized to have an outer periphery that is smaller than an inner periphery of the wire bonding pads on the active surface of the lower die 106 so that the paddle does not obscure the pads for wire bonding. It is also desirable for this reason that the lower die 106 be mounted to the die paddle 104 with an electrically insulative means, e.g., a dielectric die-attach tape, as discussed below.

Those of skill in the packaging art will appreciate that the construction of the stack of the package 100 can be effected fully automatically, i.e., the dies 106, die paddle 104, interposer 180, and spacer 110 in the stack can all be placed and laminated therein with layers of various kinds of adhesive 112 using automatic, programmable pick-and-place and adhesive-dispensing equipment currently available from a wide variety of vendors. The layers of adhesive 112 in the stack can variously comprise well-known types of package construction adhesives, e.g. solder, liquid epoxy resin, a "filled" epoxy resin (for enhanced thermal or electrical conductivity), double-backed adhesive "die-attach" tape, or various thermosetting or light-activated adhesive films.

It will also be appreciated that the wire bonds 108 between the wire bonding pads 84 on the interposer 80, the dies 106, and the leads 102 can likewise be effected with conventional manual or automated wire bonding equipment. However, as is shown in FIG. 1, where an upper die 106 has an outer periphery that is the same size as or larger than that of the interposer 180 and/or the lower die 106 so as to obscure the wire bonding pads around the respective peripheries of one or both of the latter elements, the wire bonding must be effected in alternating steps with the lamination steps. Additionally, in such instances, routing of signals between the lower and upper dies 106 and/or the interposer 180 will require an intermediate bond to one or more of the leads 102.

Thus, for example, in the first embodiment 100 in FIG. 1, the lower die 106 and the interposer 180 are first laminated to the die paddle 104, and first wire bonds 108 are made between the lower die, the interposer, and the leads 102, from the top aspect of the stack. The spacer 110 and the upper die 106 are then laminated onto the stack, followed by a second wire bonding step in which wire bonds 108 are made between the upper die and the leads 102, also from the top of the stack. However, in other possible package embodiments described in more detail below, namely, those in which the upper dies 106 are smaller than the lower dies and/or the interposer 180, the wire bond 108 interconnections can all be made in a single operation after all of the laminations in the stack are made, and from either the top or the bottom of the stack, or from both directions.

Another, optional enhancement afforded by the present invention is illustrated in the first exemplary embodiment of package 100 shown in FIG. 1, namely, a thermally enhanced embodiment, which can be obtained by interposing a heat dissipater, or heat sink 114, between a lower surface 116 of the body of the package 100 and a lowermost one of the elements in the stack of the dies 106, the spacer 110, the die paddle 104, and the interposer 180, which element, in the first embodiment illustrated, consists of the lower die 106. The heat sink 114 can comprise a simple "slug" of a material that has a high thermal conductivity, e.g., copper or beryllium-copper.

In "molded" packages of the type illustrated, i.e., those in which the dies 106, wire bonds 108, and interior ends of the leads 102 are encapsulated in a monolithic body 118 of dense plastic to protect them against environmental agents, a lower surface 120 of the heat sink 114 can be exposed through and/or flush with the lower surface 116 of the plastic package body 118 for enhanced thermal performance. For even better thermal performance, an upper surface of the heat sink 118 can be laminated to the lower surface of the lowermost element in the stack with, e.g., a layer of an adhesive 112 that is filled with a thermally conductive material, e.g., particulate silver.

In yet another alternative, thermally enhanced embodiment (not illustrated), the heat sink 114 can be interposed between an upper surface of the package body 118 and the uppermost one of the elements in the stack. In any case, the position of the exposed surface 120 of the heat sink 114 relative to the package body 118 can be simply yet accurately controlled by the amount of "up-set" or "down-set" formed into the die paddle 104 of the leadframe.

Figure 2:
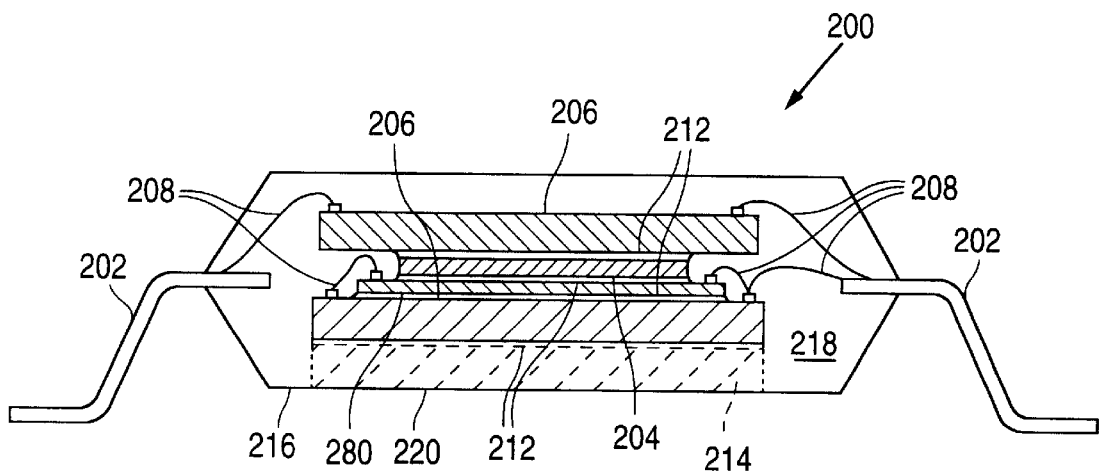
FIG. 2 is a cross-sectional, side elevation view of a second exemplary embodiment of a semiconductor package in accordance with the present invention.

A second exemplary embodiment of a package 200 in accordance with the present invention is illustrated in FIG. 2, wherein identical or similar elements are referenced with numerals corresponding to those in FIGS. 1 and 8, but in which the most significant digit thereof is incremented to the corresponding figure number. In the second embodiment of package 200, no spacer is used, and the interposer 280 is laminated between the lower surface of the die paddle 204 and the upper surface of the lower die 206. To this end, the die paddle 204 has an outer periphery that is smaller than an inner periphery of the wire bonding pads 284 on the upper surface of the interposer 280, whereas, the interposer itself has an outer periphery that is smaller than the inner periphery of the wire bonding pads on the lower die 106. As in the first embodiment 100, the stack of dies 206, interposer 280, and die paddle 204 is laminated and wire bonded in sequential steps, with the upper die 106 being laminated and wire bonded last.

Figure 3:
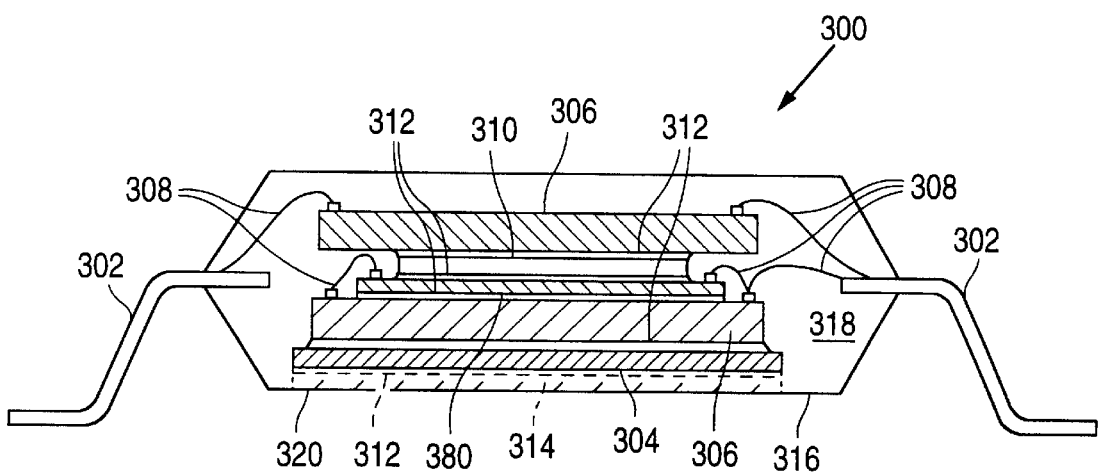
FIG. 3 is a cross-sectional, side elevation view of a third exemplary embodiment of a semiconductor package in accordance with the present invention.

FIG. 3 illustrates a third exemplary embodiment of a leadframe semiconductor package 300 in accordance with the present invention. In the third embodiment, the lower die 306 is mounted directly to the die paddle 304, then the interposer 380 is laminated between an upper surface of the lower die 306 and a lower surface of a spacer 310.

Figure 4:
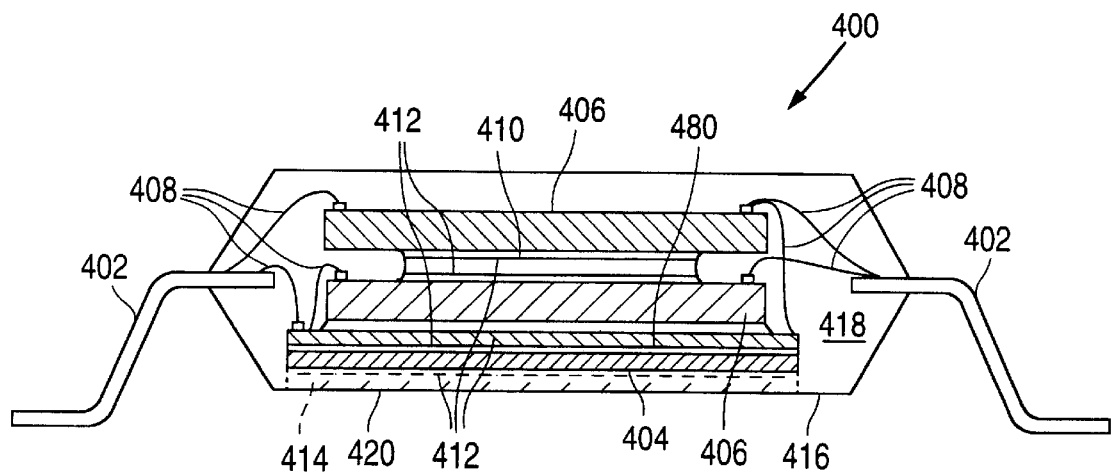
FIG. 4 is a cross-sectional, side elevation view of a fourth exemplary embodiment of a semiconductor package in accordance with the present invention.

A fourth exemplary embodiment of the package 400 is illustrated in FIG. 4. In this embodiment, which incorporates a spacer 410 between the two dies 406, the interposer 480 is laminated between an upper surface of the die paddle 404 and a lower surface of the lower die 406. In this particular embodiment, the die paddle 404 includes a relatively deep down-set, and indeed, in this embodiment, the optional heat sink 414 can be omitted, and a lower surface of the die paddle 404 can be directly exposed through the lower surface of the package body 418 for enhanced heat dissipation from the stack.

Figure 5:
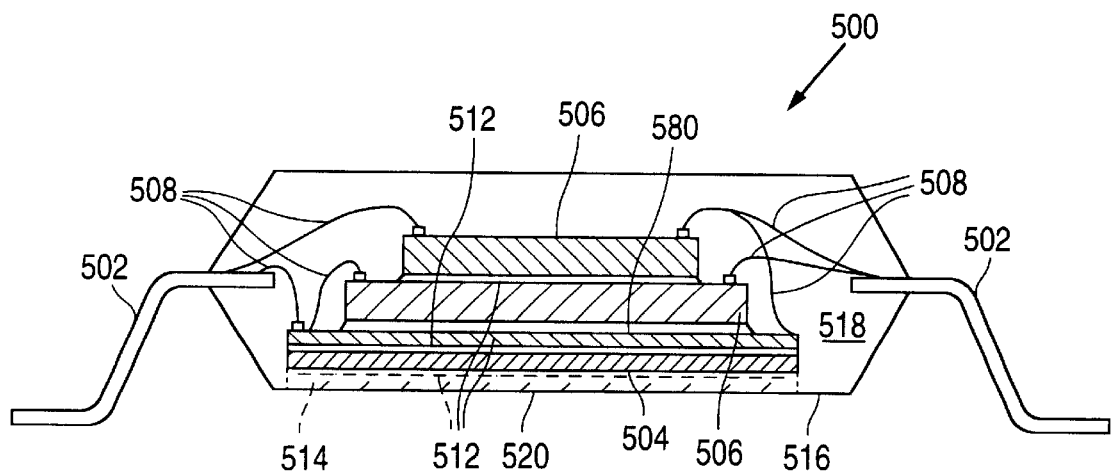
FIG. 5 is a cross-sectional, side elevation view of a fifth exemplary embodiment of a semiconductor package in accordance with the present invention.

In a fifth embodiment of the package 500 illustrated in FIG. 5, the interposer 580 is laminated between an upper surface of the die paddle 504 and a lower surface of the lower die 506. Additionally, the upper die 506 has an outer periphery smaller than an inner periphery of the wire bonding pads on both the interposer 580 and the lower die 506. Accordingly, in this embodiment, the wire bonds 508 can all be effected from the top of the stack and in one step after all of the laminations in the stack have been made. As in the fourth embodiment, the optional heat sink 514 can be omitted, and the die paddle 504 afforded a slightly greater down-set, to expose the lower surface of the die paddle itself for enhanced heat dissipation.

Figure 6:
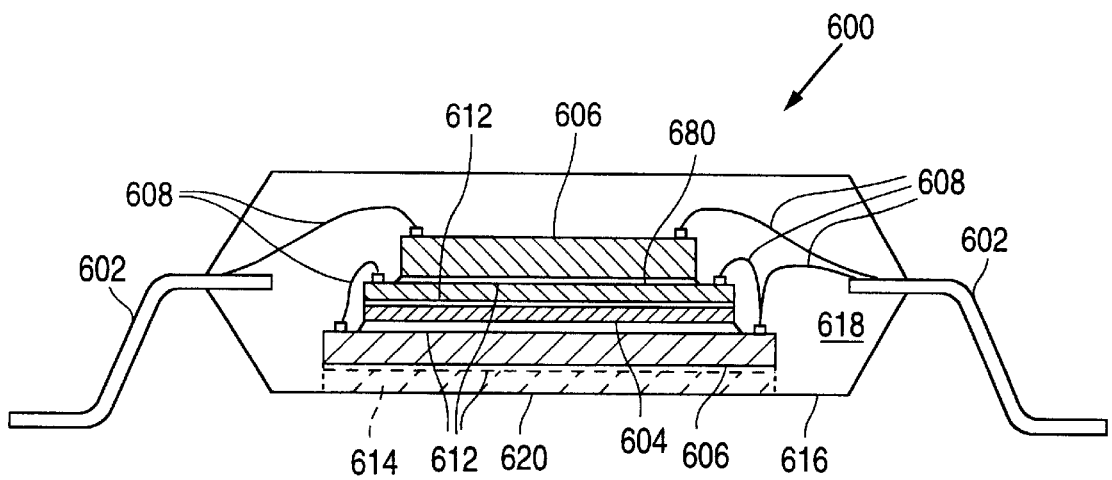
FIG. 6 is a cross-sectional, side elevation view of a sixth exemplary embodiment of a semiconductor package in accordance with the present invention.

A similar arrangement obtains in the sixth embodiment of package 600 illustrated in FIG. 6. In the sixth embodiment, the interposer 680 is laminated in the stack between an upper surface of the die paddle 604 and a lower surface of the upper die 606. In this embodiment, it is possible to omit the optional heat sink 614 and expose the lower surface of the lower die 606 itself for enhanced heat transfer purposes.

Figure 7:
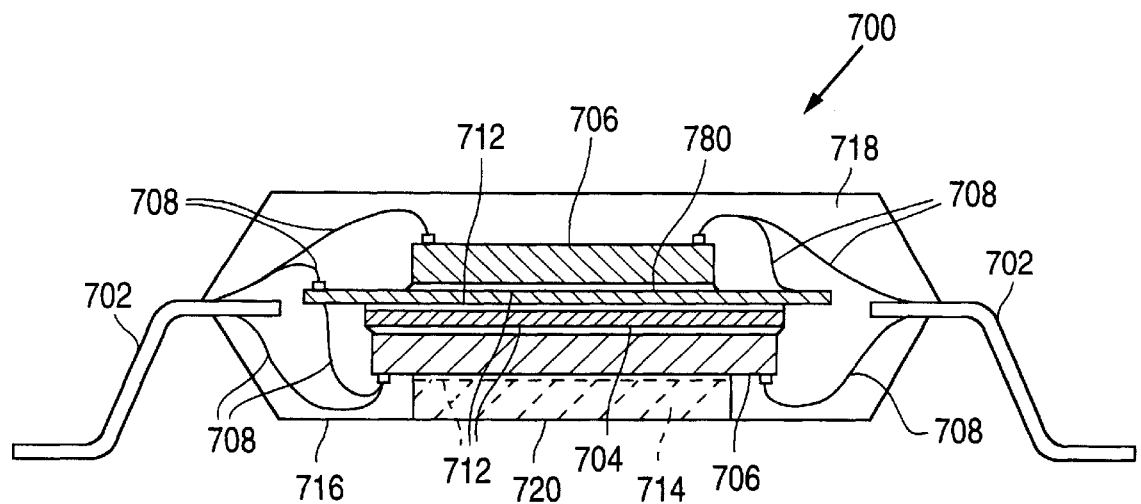
FIG. 7 is a cross-sectional, side elevation view of a seventh exemplary embodiment of a semiconductor package in accordance with the present invention; and, FIG. 8 is a top plan view of an exemplary embodiment of an interposer in accordance with the present invention.

A seventh embodiment of semiconductor package 700 in accordance with the present invention is illustrated in FIG. 7. In this embodiment, the interposer 780 is laminated between the upper surface of the die paddle 704 and the lower surface of the upper die 706. Additionally, in the seventh embodiment of package 700, both the upper and lower dies 706 have an outer periphery that is smaller than the inner periphery of the wire bonding pads on the interposer 780, which, in this exemplary embodiment, are formed at the periphery of both surfaces thereof. Accordingly, the wire bonds 708 are all made in a single step after all of the laminations of the stack are made, but the stack is inverted during the wire bonding step so that the wire bonds 708 to the bottom surfaces of the lower die 706, the interposer 780, and the leads 704 can be effected. Also, if an optional heat sink 714 is implemented in the package 700, as above, it is desirable that the heat sink have an outer periphery that is smaller than the inner periphery of the wire bonding pads on the active surface of the lower die 706 so as not to obscure the pads during such a bottom-side-up wire bonding step.

By now, those of skill in the art will appreciate that many modifications and variations are possible in the methods and materials of the present invention, depending on the particular problem at hand. Accordingly, the scope of this invention should not be limited to that of the particular embodiments illustrated and described herein, as these are merely exemplary in nature. Rather, the scope of the invention should be commensurate with that of the claims appended below and the functional equivalents thereof.

We claim:

1. A semiconductor package comprising:

a metallic leadframe having a plurality of leads arrayed along a side of a die paddle;

a plurality of semiconductor dies, each having wire bonding pads arrayed around a periphery of an active surface thereof and laminated in a stack with the die paddle, the active surfaces of the plurality of semiconductor dies being oriented in a same direction;

a plurality of wire bonds electrically interconnecting selected ones of the die bonding pads and the leads; and an interposer having a dielectric layer and a metallic layer patterned to include wire bonding pads arrayed around a periphery of a surface thereof, and circuit traces electrically interconnecting selected ones of the wire bonding pads, the interposer being laminated in the stack of the dies and the die paddle, the wire bonds electrically interconnecting selected ones of the die bonding pads, the interposer bonding pads, and the leads.

2. The semiconductor package of claim 1, further comprising a spacer laminated in the stack of the dies, the die paddle, and the interposer.

3. The semiconductor package of claim 2, wherein the interposer is laminated between a surface of the spacer and a surface of one of the dies.

4. The semiconductor package of claim 2, wherein the interposer is laminated between a surface of the die paddle and a surface of the spacer.

5. The semiconductor package of claim 2, wherein the interposer, the die paddle and the spacer are between a first one of the plurality of semiconductor dies and a second one of the semiconductor dies.

6. The semiconductor package of claim 2, wherein the spacer and the interposer are between a first one of the plurality of semiconductor dies and a second one of the semiconductor dies.

7. The semiconductor package of claim 2, wherein the die paddle and the spacer are between a first one of the plurality of semiconductor dies and a second one of the semiconductor dies.

8. The semiconductor package of claim 2, wherein the stack is arranged in the following order from top to bottom: a first semiconductor die, the spacer, the interposer, the die paddle, a second semiconductor die.

9. The semiconductor package of claim 1, wherein the interposer is laminated between a surface of the die paddle and a surface of one of the dies.

10. The semiconductor package of claim 1, wherein the dies, the die paddle, and the interposer are laminated in the stack with layers of an adhesive.

11. The semiconductor package of claim 10, wherein the layers of adhesive comprise solder, liquid epoxy resin, a filled epoxy resin, double-backed adhesive tape, or an adhesive film.

12. The semiconductor package of claim 1, further comprising a heat sink interposed between a lower surface of the package and a lowermost one in the stack of the dies, the die paddle, and the interposer, the heat sink having a lower surface exposed through a lower surface of the package.

13. The semiconductor package of claim 12, wherein the heat sink has an upper surface laminated to a lower surface of the lowermost one of the dies, the die paddle, and the interposer.

14. The semiconductor package of claim 1, further comprising a heat sink interposed between an upper surface of the package and an uppermost one in the stack of the dies, the die paddle, and the interposer, the heat sink having an upper surface exposed through an upper surface of the package.

15. The semiconductor package of claim 14, wherein the heat sink has a lower surface laminated to an upper surface of the uppermost one of the dies, the die paddle, and the interposer.

16. The semiconductor package of claim 1, wherein the dielectric layer of the interposer comprises polyimide, fiberglass-epoxy or a ceramic, and wherein the metallic layer thereof comprises copper, aluminum, or tungsten.

17. The semiconductor package of claim 1, wherein the interposer and the die paddle are between a first one of the plurality of semiconductor dies and a second one of the semiconductor dies.

18. A semiconductor package comprising:
   a metal leadframe including a die paddle and a plurality of leads;
   two semiconductor dies each having perimeter and bond pads adjacent said perimeter, wherein at least some of the bond pads of one or both of the semiconductor dies are electrically coupled to some of said leads; and
   an interposer comprising a dielectric layer and at least one metallic layer including circuit traces;
   wherein said semiconductor dies are stacked with the die paddle and the interposer between them, the bond pads of the two semiconductor dies are oriented in a same direction, and at least some of the bond pads of one said semiconductor die are electrically coupled to at least some of the bond pads of the other said semiconductor die through some of said circuit traces.

19. The semiconductor package of claim 18, wherein the two semiconductor dies each have a perimeter of a same size.

20. The semiconductor package of claim 19, wherein the interposer and the die paddle have a perimeter of a lesser size than a perimeter of the two semiconductor dies.

21. The semiconductor package of claim 20, wherein the perimeter of the interposer is greater in size than the perimeter of the die paddle.

22. The semiconductor package of claim 18, further comprising a spacer stacked between the two semiconductor dies.

23. The semiconductor package of claim 22, wherein the interposer is between the die paddle and the spacer.

24. The semiconductor package of claim 18, wherein one or both of the semiconductor dies are electrically coupled to said leads by wire bonds, and some of said leads are electrically coupled to said circuit traces of the interposer by wire bonds.

25. A semiconductor package comprising:
   a metal leadframe including a die paddle and a plurality of leads;
   two semiconductor dies each having perimeter and bond pads adjacent said perimeter, wherein at least some of the bond pads of one or both of the semiconductor dies are electrically coupled to some of said leads; and
   an interposer comprising a dielectric layer and at least one metallic layer including circuit traces;
   wherein said semiconductor dies are stacked with the die paddle and the interposer, the bond pads of the two semiconductor dies are oriented in a same direction, and at least one said bond pad of one said semiconductor die are electrically coupled to at least said bond pad of the other said semiconductor die through at least one wire bond and one said circuit trace.

26. The semiconductor package of claim 25, wherein the interposer and the die paddle are disposed between the two semiconductor dies.

27. The semiconductor package of claim 25, further comprising a heat sink thermally coupled to one of said semiconductor dies.

28. The semiconductor package of claim 25, wherein the two semiconductor dies each have a perimeter of a same size.

29. The semiconductor package of claim 28, wherein the interposer and the die paddle have a perimeter of a lesser size than a perimeter of the two semiconductor dies.

30. The semiconductor package of claim 29, wherein the perimeter of the interposer is greater in size than the perimeter of the die paddle.

31. The semiconductor package of claim 25, further comprising:
   a spacer stacked between the two semiconductor dies; and
   wire bonds electrically coupling some of the leads to some of the bond pads of each of said semiconductor dies.

32. The semiconductor package of claim 25, wherein the interposer is between the die paddle and one of said semiconductor dies.

33. The semiconductor package of claim 25, wherein the interposer is between one of said semiconductor dies and a heat sink of the semiconductor package.

* * * * *